United States Patent
Chen et al.

(10) Patent No.: US 9,907,205 B1
(45) Date of Patent: Feb. 27, 2018

(54) HEAT DISSIPATION SYSTEM AND METHOD FOR STABLIZING THE HEAT DISSIPATION SYSTEM

(71) Applicant: ANPEC ELECTRONICS CORPORATION, Hsinchu (TW)

(72) Inventors: Kun-Min Chen, Hsinchu (TW); Chien-Sheng Wang, Taichung (TW); Yin-Kai Chen, Hsinchu (TW); Ching-Feng Lai, Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/644,953

(22) Filed: Jul. 10, 2017

(30) Foreign Application Priority Data

Apr. 28, 2017 (TW) .............................. 106114289 A

(51) Int. Cl.
*G06F 1/20* (2006.01)
*H05K 7/20* (2006.01)
*H02P 3/02* (2006.01)

(52) U.S. Cl.
CPC ............ *H05K 7/20209* (2013.01); *H02P 3/02* (2013.01); *H05K 7/20136* (2013.01)

(58) Field of Classification Search
CPC .......... G05B 5/00; G05B 11/28; G05D 23/00; G06F 1/20; H02P 1/00; H02P 3/00; H02P 5/00; H02P 6/00
USPC .......... 318/471, 472, 400.01, 700, 701, 726, 318/727, 779, 799, 599, 811; 123/41.01, 123/41.48, 41.49, 41.56, 392; 361/676, 361/678, 679.46, 679.47, 679.48, 688, 361/690, 831; 700/153, 296, 300, 304; 165/250, 269, 287, 291, 58, 48.1, 104.33; 73/114.68, 152.13, 204.16, 204.23, 73/863.11
See application file for complete search history.

(56) References Cited

U.S. PATENT DOCUMENTS

| | | | |
|---|---|---|---|
| 5,484,012 A * | 1/1996 | Hiratsuka | G11B 33/142 165/247 |
| 7,347,167 B2 * | 3/2008 | Sugiyama | F01P 7/048 123/41.11 |
| 2007/0297893 A1 * | 12/2007 | Alon | F04D 25/166 415/47 |

* cited by examiner

*Primary Examiner* — Antony M Paul
(74) *Attorney, Agent, or Firm* — Li & Cai Intellectual Property (USA) Office

(57) ABSTRACT

A heat dissipation system at lease has a first fan module including a first fan and a first fan driving circuit. The first fan driving circuit generates a fan driving signal to drive the first fan. When a control module transmits a stopping signal to the first fan module, the first fan driving circuit decreases a duty cycle of the fan driving signal driving the first fan according to the stopping signal. When the duty cycle of the fan driving signal driving the first fan is less than or equal to a first predetermined duty cycle, within a first working time, the first fan driving circuit decreases the duty cycle of the fan driving signal driving the first fan to zero by subtracting one predetermined duty interval from the duty cycle of the fan driving signal driving the first fan every predetermined working time interval.

17 Claims, 7 Drawing Sheets

HEAT DISSIPATION SYSTEM AND METHOD FOR STABLIZING THE HEAT DISSIPATION SYSTEM

BACKGROUND OF THE INVENTION

1. Field of the Invention

The present disclosure relates to a heat dissipation system; in particular, to a heat dissipation system having a high stability.

2. Description of Related Art

Many of electronic devices need a heat dissipation system. Currently, more and more heat dissipation systems include more than one fan module. Usually, in a heat dissipation system, when a control module transmits a stopping signal, the fan module will be promptly stopped if the rotation speed of the fan module is less than a predetermined value. However, at this time, the heat generating source of the heat dissipation system still has a high temperature and thus the temperature of the heat dissipation system will continue to increase. As a result, a control module generates a start signal to the fan module because it determines that the temperature of the heat dissipation system is increasing, which results in oscillations of the heat dissipation system.

In addition, due to the manufacturing differences of the control modules, it is hard to realize the synchronous control of the fan modules.

FIG. 1 shows a rotation speed curve of a traditional multi-fans heat dissipation system according to one embodiment of the present disclosure, and FIG. 2 shows that the duty cycle of a fan driving signal is promptly decreased in a traditional heat dissipation system. In FIG. 1, the rotation speed curve I and the rotation speed curve II are rotation speed curves of different fan modules. According to the rotation speed curve I, the minimum duty cycle is set as the first duty cycle d1 and the maximum duty cycle is set as the third duty cycle d3. According to the rotation speed curve II, the minimum duty cycle is set as the second duty cycle d2 and the maximum duty cycle is set as the fourth duty cycle d4. The difference between the rotation speed curve I and the rotation speed curve II results from the manufacturing differences of the fan driving circuits. Thus, even when different fan modules receive the same stopping signal from a control module, the controls of the fan modules made by the fan driving circuits in the heat dissipation system may show different results. For example, one fan module is stopped but another fan module is still working, or one fan module cannot work anymore but other fan modules are still working. In these examples, the control module will still determine that the heat dissipation system is working normally, and as a result, heat cannot be dissipated evenly and the heat dissipation system may breakdown.

According to FIG. 2, in the traditional heat dissipation system, when the rotation speed of the fan module is less than a minimum duty cycle $D_{SD}$, the rotation speed of this fan module will be promptly decreased to zero, which results in noises and the mechanical damages. As a result, the reliability and the lifetime of the heat dissipation system will be decreased.

Therefore, it is necessary to have a more stable heat dissipation system of which the reliability is higher and the lifetime lasts longer.

SUMMARY OF THE INVENTION

The present disclosure provides a heat dissipation system. This heat dissipation system receives a fan control signal from a control module. The first fan module includes a first fan and a first fan driving circuit. The first fan driving circuit generates a fan driving signal to drive the first fan. When the control module transmits a stopping signal to the first fan module, the first fan driving circuit decreases a duty cycle of the fan driving signal driving the first fan according to the stopping signal. When the duty cycle of the fan driving signal driving the first fan is less than or equal to a first predetermined duty cycle, within a first working time, the first fan driving circuit decreases the duty cycle of the fan driving signal driving the first fan to zero by subtracting one predetermined duty interval from the duty cycle of the fan driving signal driving the first fan every predetermined working time interval.

In one embodiment of the heat dissipation system provided by the present disclosure, the heat dissipation system further includes a second fan module. This second fan module includes a second fan and a second fan driving circuit. The second fan driving circuit generates a fan driving signal to drive the second fan. When the control module transmits a stopping signal to the second fan module, the second fan driving circuit decreases a duty cycle of the fan driving signal driving the second fan according to the stopping signal. When the duty cycle of the fan driving signal driving the second fan is less than or equal to the first predetermined duty cycle, within the first working time, the second fan driving circuit decreases the duty cycle of the fan driving signal driving the second fan to zero by subtracting one predetermined duty interval from the duty cycle of the fan driving signal driving the second fan every predetermined working time interval.

In one embodiment of the heat dissipation system provided by the present disclosure, the first fan module and the second fan module stop rotating simultaneously according to the stopping signal.

In one embodiment of the heat dissipation system provided by the present disclosure, a first reference voltage is a direct voltage larger than zero, a second reference voltage is a grounding voltage, a third reference voltage is a direct voltage larger than zero, and a fourth reference voltage is a grounding voltage.

In one embodiment of the heat dissipation system provided by the present disclosure, the first working time is N times of the predetermined working time interval, and N is a positive integer.

In one embodiment of the heat dissipation system provided by the present disclosure, a first duty cycle is M times of the predetermined duty interval, and M is a positive integer.

In one embodiment of the heat dissipation system provided by the present disclosure, the first fan driving circuit includes a control unit, a processing unit, a driving unit, a detecting unit and a duty cycle adjusting unit. The processing unit receives the stopping signal and converts the stopping signal to a processing signal, and the stopping signal is a PWM signal. The driving unit is electrically connected to the control unit. The driving unit generates the fan driving signal to drive the first fan according to at least one control signal from the control unit. The detecting unit determines the first predetermined duty cycle of the stopping signal. The duty cycle adjusting unit adjusts the duty cycle of the fan driving signal driving the first fan according to the first predetermined duty cycle. When the duty cycle of the fan driving signal driving the first fan is less than or equal to the first predetermined duty cycle, within the first working time, the duty cycle adjusting unit decreases the duty cycle of the fan driving signal driving the first fan to zero by subtracting one predetermined duty interval from the duty cycle of the fan driving signal driving the first fan every predetermined working time interval.

In one embodiment of the heat dissipation system provided by the present disclosure, when the duty cycle of the fan driving signal driving the first fan is less than or equal to the first predetermined duty cycle, within the first working time, the first fan driving circuit decreases the duty cycle of the fan driving signal driving the first fan from the first predetermined duty cycle to zero by subtracting one predetermined duty interval from the duty cycle of the fan driving signal driving the first fan every predetermined working time interval.

In one embodiment of the heat dissipation system provided by the present disclosure, when the duty cycle of the fan driving signal driving the second fan is less than or equal to the first predetermined duty cycle, within the first working time, the second fan driving circuit decreases the duty cycle of the fan driving signal driving the second fan from the first predetermined duty cycle to zero by subtracting one predetermined duty interval from the duty cycle of the fan driving signal driving the second fan every predetermined working time interval.

In one embodiment of the heat dissipation system provided by the present disclosure, when the duty cycle of the fan driving signal driving the first fan is less than or equal to the first predetermined duty cycle, within the first working time, the first fan driving circuit decreases the duty cycle of the fan driving signal driving the first fan from a second predetermined duty cycle to zero by subtracting one predetermined duty interval from the duty cycle of the fan driving signal driving the first fan every predetermined working time interval.

In one embodiment of the heat dissipation system provided by the present disclosure, when the duty cycle of the fan driving signal driving the second fan is less than or equal to the first predetermined duty cycle, within the first working time, the second fan driving circuit decreases the duty cycle of the fan driving signal driving the second fan from a second predetermined duty cycle to zero by subtracting one predetermined duty interval from the duty cycle of the fan driving signal driving the second fan every predetermined working time interval.

The present disclosure also provides a method for stabilizing a heat dissipation system. This method includes: receiving a stopping signal; decreasing a duty cycle of a fan driving signal; determining whether the duty cycle of the fan driving signal is less than or equal to a first predetermined duty cycle; decreasing the duty cycle of the fan driving signal by subtracting one predetermined duty interval every predetermined time interval; and determining whether the duty cycle of the fan driving signal equals zero.

In one embodiment of the method provided by the present disclosure, after the step of determining whether the duty cycle of the fan driving signal is less than or equal to the first predetermined duty cycle, the method further includes: adjusting the duty cycle of the fan driving signal to be a second predetermined duty cycle.

In one embodiment of the method provided by the present disclosure, the method further includes: decreasing the duty cycle of the fan driving signal from the first predetermined duty cycle to zero by subtracting one predetermined duty interval from the duty cycle of the fan driving signal every predetermined working time interval.

In one embodiment of the method provided by the present disclosure, the method further includes: decreasing the duty cycle of the fan driving signal from the second predetermined duty cycle to zero by subtracting one predetermined duty interval from the duty cycle of the fan driving signal every predetermined working time interval.

To sum up, in the heat dissipation system and the method for stabilizing the heat dissipation system provided by the present disclosure, when one fan module receives a stopping signal, the duty cycle of the fan driving signal will be gradually decreased within a first working time. In this manner, there are no noises and the mechanical damages resulted from promptly stopping the fan module, which increases the reliability of the heat dissipation system. In addition, if the heat dissipation system has a plurality of fan modules, these fan modules can be stopped simultaneously. Therefore, the synchronous control of these fan modules can be realized.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

There are several embodiments provided for illustrating the power control circuit and the power control method in the present disclosure, but it is not limited thereto.

[One Embodiment of the Heat Dissipation System]

Figure 3:
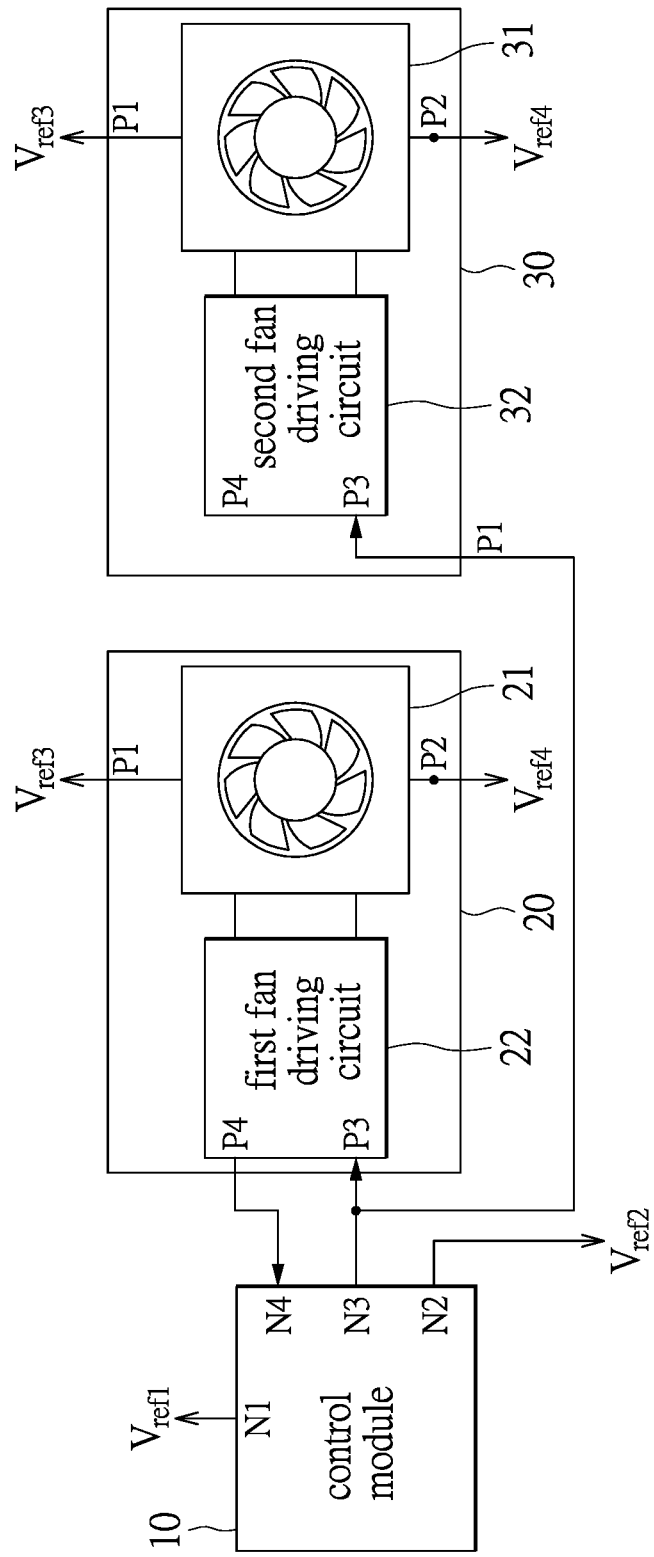
FIG. 3 shows a schematic diagram of a heat dissipation system according to one embodiment of the present disclosure.
Figure 4:
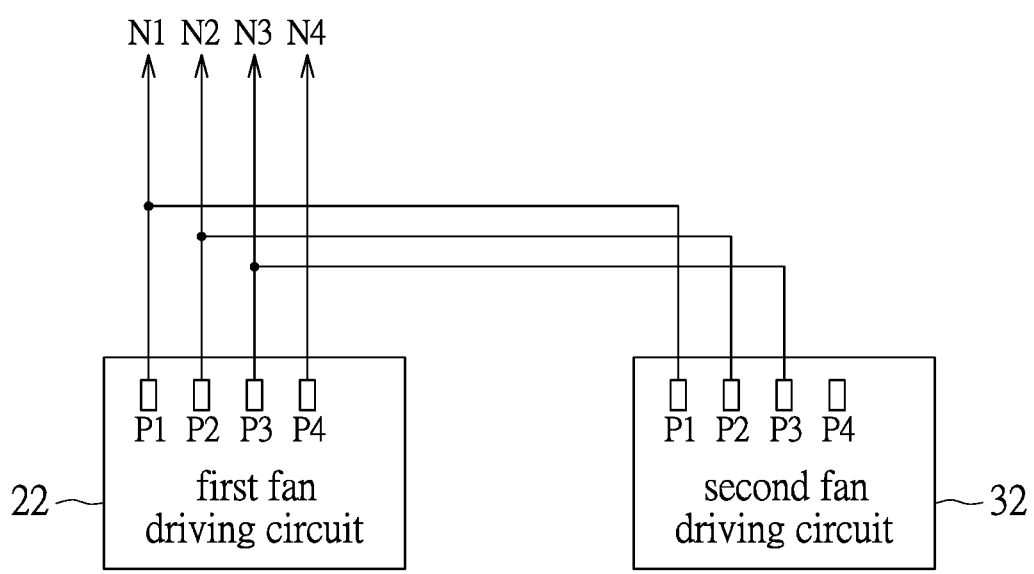
FIG. 4 is a schematic diagram showing the connection relationships of pins in a heat dissipation system according to one embodiment of the present disclosure.
Figure 5A:
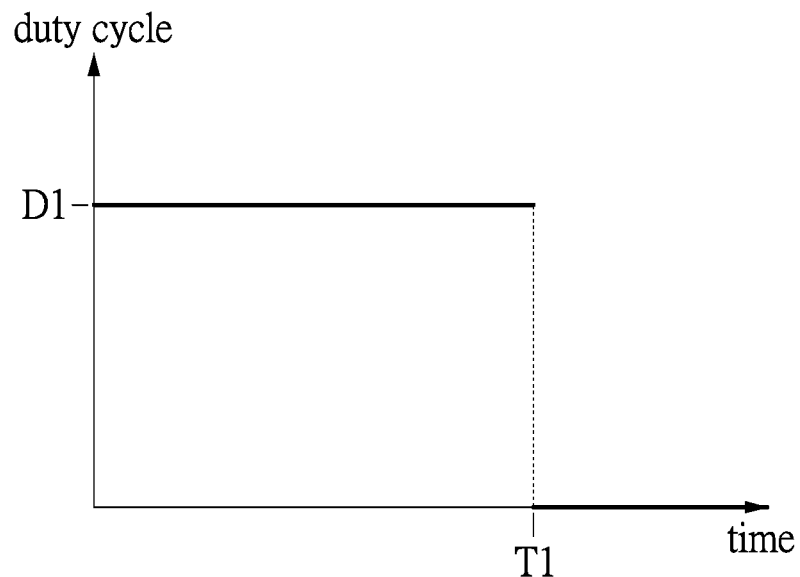
FIG. 5A is a schematic diagram showing that the duty cycle of a fan driving signal is decreased in a heat dissipation system according to one embodiment of the present disclosure.
Figure 5B:
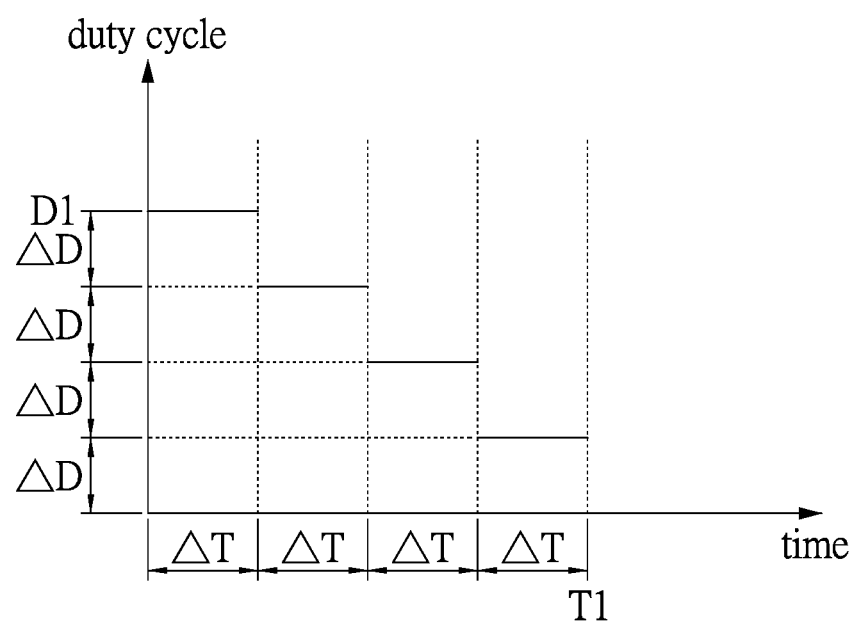
FIG. 5B is a schematic diagram showing that the duty cycle of a fan driving signal is gradually decreased in a heat dissipation system according to one embodiment of the present disclosure.

FIG. 3 shows a schematic diagram of a heat dissipation system according to one embodiment of the present disclosure, and FIG. 4 is a schematic diagram showing the connection relationships of pins in a heat dissipation system according to one embodiment of the present disclosure. In addition, FIG. 5A is a schematic diagram showing that the duty cycle of a fan driving signal is decreased in a heat dissipation system according to one embodiment of the present disclosure, and FIG. 5B is a schematic diagram showing that the duty cycle of a fan driving signal is gradually decreased in a heat dissipation system according to one embodiment of the present disclosure.

As shown in FIG. 3, the heat dissipation system 1 includes a control module 10, a first fan module 20 and a second fan module 30. For ease of illustration, the number of the fan modules is set as two in this embodiment; however, the number of the fan modules is not thus restricted.

The control module 10 has a first pin N1, a second pin N2, a third pin N3 and a fourth pin N4. The first pin N1 of the control module 10 is electrically connected to a first reference voltage Vref1, and the second pin N2 of the control module 10 is electrically connected to a second reference voltage Vref2. The first reference voltage Vref1 is a direct voltage larger than zero that the control module 10 requires for operation, and the value of the first reference voltage Vref1 can be adjusted depending on needs. The second reference voltage Vref2 is a grounding voltage, which is zero. However, in other embodiments, the value of the second reference voltage Vref2 can be freely designed depending on needs. The control module 10 can be configured at the system end. In other words, the control module 10 can be configured separately from the first fan module 20 and the second fan module 30.

The first fan module 20 includes a first fan 21 and a first fan driving circuit 22. The first fan module 20 has a first pin P1, a second pin P2, a third pin P3 and a fourth pin P4.

The first fan module 20 and the second fan module 30 have similar structures. The second fan module 30 includes a second fan 31 and a second fan driving circuit 32. The second fan module 30 has a first pin P1, a second pin P2, a third pin P3 and a fourth pin P4.

The first pin P1 of the first fan module 20 and the first pin P1 of the second fan module 30 are electrically connected to a third reference voltage Vref3. The second pin P2 of the first fan module 20 and the second pin P2 of the second fan module 30 are electrically connected to a fourth reference voltage Vref4. The third pin P3 of the first fan module 20 and the third pin P3 of the second fan module 30 are electrically connected to the third pin N3 of the control module 10. The fourth pin P4 of the first fan module 20 is electrically connected to the fourth pin N4 of the control module 10, but the fourth pin P4 of the second fan module 30 is connected to nothing. In other words, the fourth pin P4 of the second fan module 30 is a dead contact.

The third reference voltage Vref3 is a direct voltage larger than zero that the first fan module 20 and the second fan module 30 require for operation, and the value of the third reference voltage Vref3 can be adjusted depending on needs.

The fourth reference voltage Vref4 is a grounding voltage, which is zero. However, in other embodiments, the value of the fourth reference voltage Vref4 can be freely designed depending on needs.

The control module 10 transmits a fan control signal from its third pin N3 to the first fan driving circuit 22 of the first fan module 20 and to the second fan driving circuit 32 of the second fan module 30 for respectively driving the first fan 21 and the second fan 31. In this embodiment, the fan control signal is a PWM signal, but in other embodiments, the fan control signal can be other kinds of control signal. The fourth pin N4 of the control module 10 is configured to receive a rotation speed signal. Specifically, the first fan module 20 transmits the rotation speed signal from its fourth pin P4 to the fourth pin N4 of the control module 10. However, the fourth pin P4 of the second fan module 30 is not connected to any module or any reference voltage. Briefly, the fourth pin P4 of the second fan module 30 is a dead contact.

Referring to FIG. 4, a schematic diagram showing the connection relationships of pins in a heat dissipation system according to one embodiment of the present disclosure is shown. As shown in FIG. 4, when the control module 10 tends to stop the first fan driving circuit 22 or the second fan driving circuit 32 from working, the control module 10 transmits a stopping signal from its third pin N3 to the third pin P3 of the first fan driving circuit 22 or to the third pin P3 of the second fan driving circuit 32. According to this stopping signal, the first fan driving circuit 22 gradually decreases the duty cycle of its fan driving signal, which is for driving the first fan, to zero, or the second fan driving circuit 32 gradually decreases the duty cycle of its fan driving signal, which is for driving the second fan, to zero.

FIG. 5A is a schematic diagram shows that the duty cycle of a fan driving signal is decreased in a heat dissipation system according to one embodiment of the present disclosure, and FIG. 5B shows that the duty cycle of a fan driving signal is gradually decreased in a heat dissipation system according to one embodiment of the present disclosure. As shown in FIG. 5A, when receiving a stopping signal, the first fan module 20 or the second fan module 30 maintains its original duty cycle within the first working time T1, and after the first working time T1, the first fan module 20 or the second fan module 30 directly decreases the duty cycle of its fan driving signal to zero. Alternatively, as shown in FIG. 5B, when receiving a stopping signal, within the first working time, the first fan module 20 or the second fan module 30 starts to subtract one duty cycle unit AD from the duty cycle of its fan driving signal every predetermined time interval ΔT. In these two cases, the first working time T1 can be freely set, such as five seconds, eight seconds or even a longer time duration.

In the case shown in FIG. 5B, the first fan module 20 or the second fan module 30 decreases the duty cycle of its fan driving signal for four times. Specifically speaking, the first working time T1 is divided into four equal predetermined time intervals ΔT, and within each predetermined time interval ΔT, the first fan module 20 or the second fan module 30 subtracts one predetermined duty interval ΔD from the duty cycle of its fan driving signal. It should be noted that, the first predetermined duty cycle D1 can be divided into four equal predetermined duty intervals ΔD, and the first predetermined duty cycle D1 can be freely set depending on needs. Also, the first working time T1 can be divided into more than four equal predetermined time intervals ΔT, and the first predetermined duty cycle D1 can be divided into more than four equal predetermined duty intervals ΔD. If the first working time T1 is divided into more predetermined time intervals ΔT and the first predetermined duty cycle D1 is divided into more predetermined duty intervals ΔD, the temperature of the heat dissipation system can be stably decreased. In this manner, the oscillations may be caused by repeatedly stopping and activating the heat dissipation system can be avoided. When the first working time T1 is divided into more predetermined time intervals ΔT and the first predetermined duty cycle D1 is divided into more than four equal predetermined duty intervals ΔD, the force applied to the rotator in the fan module will be slowly decreased. If the first working time T1 is only divided into one or two predetermined time interval(s) ΔT and the first predetermined duty cycle D1 is only divided into one or two equal predetermined duty interval(s) ΔD, the force applied to the rotator in the fan module will be promptly decreased to zero. At this moment, an obvious mechanical oscillation occurs due to a reaction force. If the heat dissipation system always works in this way, the fan modules of the heat dissipation system must be damaged.

In this embodiment, the first working time T1 is N times of the predetermined time interval ΔT, and "N" is a positive integer. In other embodiments, the first working time T1 is also N times of the predetermined time interval ΔT, and "N" is larger than zero but can be an integer or not an integer. Similarly, in this embodiment, the first predetermined duty cycle D1 is M times of the predetermined duty intervals ΔD, and "M" is a positive integer. In other embodiments, the first predetermined duty cycle D1 is also M times of the predetermined duty intervals ΔD, and "M" is larger than zero but can be an integer or not an integer. In the case shown in FIG. 5A, the predetermined time interval ΔT equals the first working time T1, and the predetermined duty interval ΔD equals the first predetermined duty cycle D1.

In this embodiment, the first fan driving circuit 22 and the second fan driving circuit 32 respectively includes a counting circuit (not shown) for counting a predetermine time, such as the first working time T1.

Figure 6:
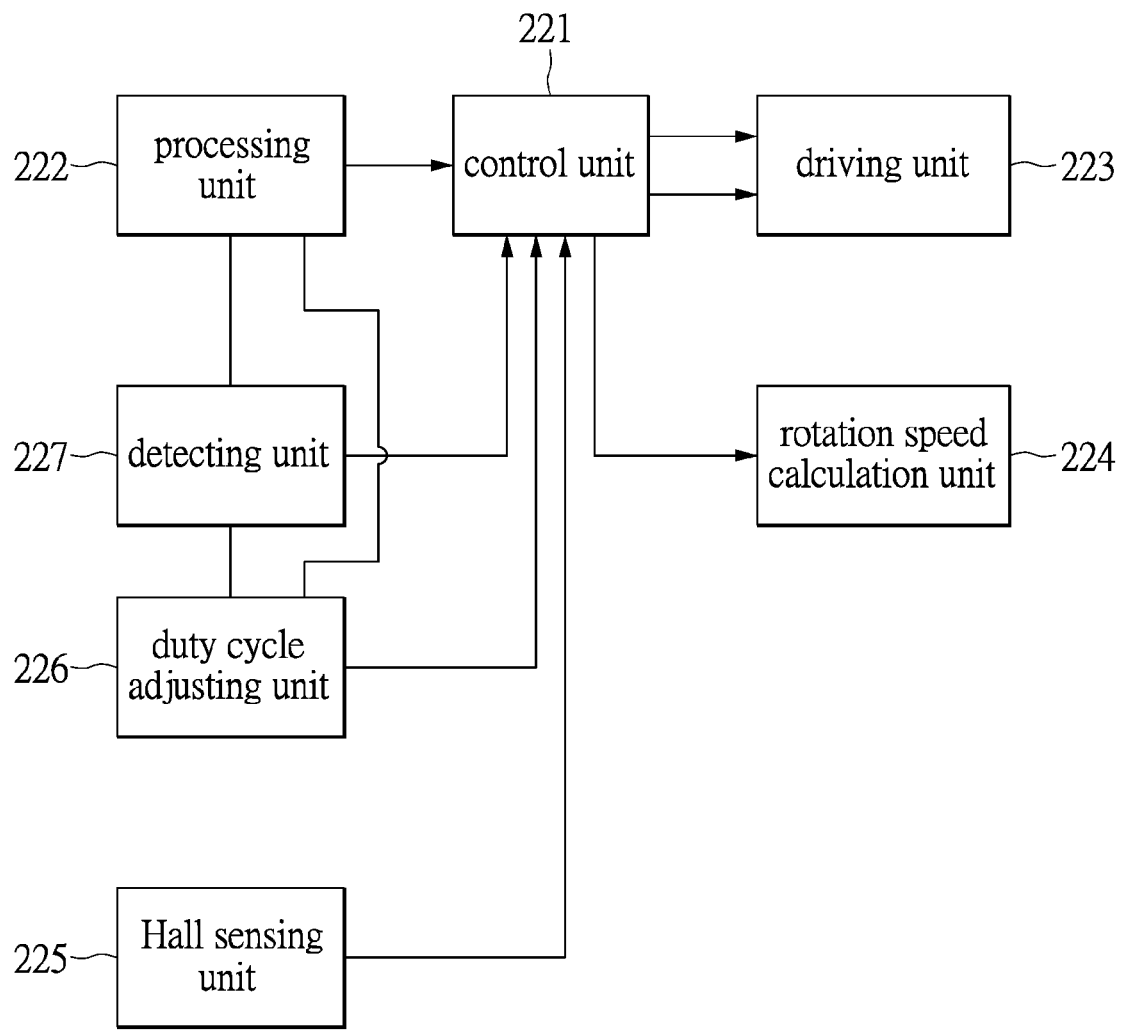
FIG. 6 shows a schematic diagram of a first fan driving circuit in a heat dissipation system according to one embodiment of the present disclosure.

Referring to FIG. 6, a schematic diagram of a first fan control circuit in a heat dissipation system according to one embodiment of the present disclosure is shown.

The first fan module 20 and the second fan module 30 have similar structures, and thus only the working principle of the first fan driving circuit 22 is illustrated in the following description.

As shown in FIG. 6, the first fan driving circuit 22 includes a control unit 221, a processing unit 222, a driving unit 223, a rotation speed calculation unit 224, a Hall sensing unit 225, a duty cycle adjusting unit 226 and a detecting unit 227.

The processing unit 222 is electrically connected to the third pin P3 of the first fan module 20. After receiving a fan control signal from the control module 10, the processing unit 222 processes the fan control signal and converts the fan control signal to a processing signal. This processing signal is then transmitted to the control unit 221 or to the detecting unit 227, and according to the processing signal the control unit 221 generates a plurality of control signals and transmits the control signals to the driving unit 223.

The driving unit 223 is electrically connected to the control unit 221. The driving unit 223 generates a plurality of fan driving signals according to the control signals from the control unit 221, and these fan driving signals are transmitted to the first fan 21 for driving the first fan 21. In this embodiment, the driving unit 223 can be an H-bridge driving circuit, a bridge driving circuit or a three-phase bridge driving circuit, in which the H-bridge driving circuit includes four MOSFETs or BJTs. In addition, in this embodiment, the driving unit 223 can be a driving circuit of a single-phase motor, but in other embodiments, the driving unit 223 can be a driving circuit of a dual-phase motor or a three-phase motor.

The rotation speed calculation unit 224 is electrically connected to the control unit 221. Specifically, the rotation speed calculation unit 224 is electrically connected to the fourth pin P4 of the first fan module 20, and thus the rotation speed calculation unit 224 transmits signals through the fourth pin P4 of the first fan module 20. The rotation speed calculation unit 224 generates a rotation speed signal according to a phase variation sensed by the Hall sensing unit 225. Specifically, the rotation speed calculation unit 224 transmits the rotation speed signal, corresponding to the phase variation sensed by the Hall sensing unit 225, to the control module 10 through the fourth pin P4 of the first fan module 20.

The Hall sensing unit 225 is electrically connected to the control unit 221. The Hall sensing unit 225 is configured to sense the phase variation of the first fan 21 and accordingly generate and transmit a Hall sensing signal to the control unit 221.

The processing unit 222 is electrically connected to the detecting unit 227 and the duty cycle adjusting unit 226, the detecting unit 227 is electrically connected to the control unit 221 and the duty cycle adjusting unit 226, and the duty cycle adjusting unit 226 is electrically connected to the control unit 221.

Figure 1:
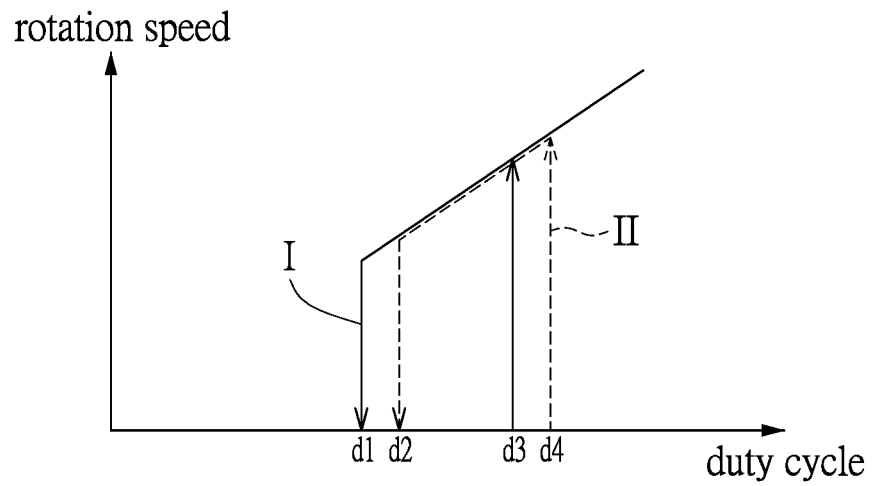
FIG. 1 is a schematic diagram showing a rotation speed curve of a traditional multi-fans heat dissipation system according to one embodiment of the present disclosure.
Figure 2:
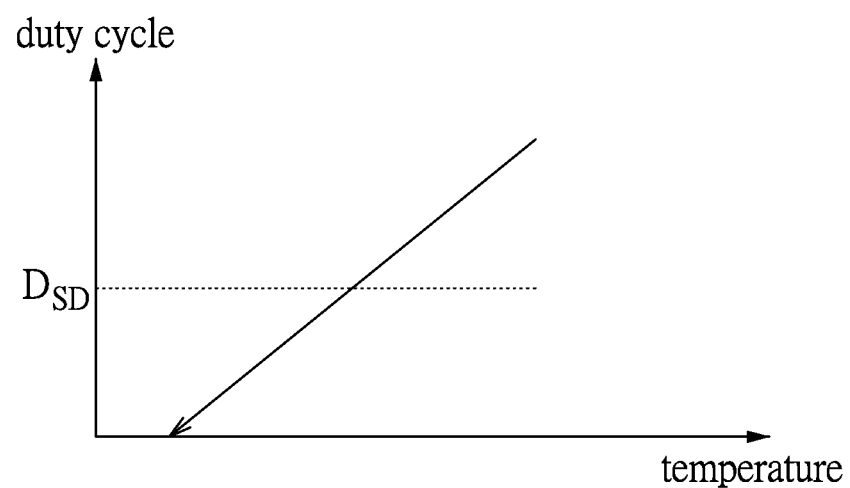
FIG. 2 is a schematic diagram showing that the duty cycle of a fan driving signal is promptly decreased in a traditional heat dissipation system.

After receiving the stopping signal from the control module 10, the processing unit 222 transmits this stopping signal to the detecting unit 227. Then, the detecting unit 227 determines the minimum duty cycle $D_{SD}$ of the stopping signal (as shown in FIG. 2), and provides the minimum duty cycle $D_{SD}$ of the stopping signal to the control unit 221 and the duty cycle adjusting unit 226. In addition, the processing unit 222 also provides the minimum duty cycle $D_{SD}$ of the stopping signal to the duty cycle adjusting unit 226.

It is worth mentioning that, the stopping signal is one kind of fan control signal, and the stopping signal can be a PWM signal. In addition, the first predetermined duty cycle D1 (as shown in FIG. 5) can be equal to or unequal to the minimum duty cycle $D_{SD}$. When the control unit 221 determines that the duty cycle of the current fan driving signal for driving the first fan is less than or equal to the first predetermined duty cycle D1, the control unit 221 controls the duty cycle adjusting unit 226 to subtract one predetermined duty interval ΔD from the duty cycle of the fan driving signal within one predetermined working time interval ΔT. In this manner, the duty cycle of the fan driving signal can be gradually decreased. It should be noted that, when the duty cycle of the current fan driving signal for driving the first fan is determined to be less than or equal to the first predetermined duty cycle D1, the duty cycle of the fan driving signal can be gradually decreased from the first predetermined duty cycle D1, or can be adjusted to be a second predetermined duty cycle D2 (not shown) and then be gradually decreased from the second predetermined duty cycle D2. In this embodiment, the first predetermined duty cycle D1 equals to the minimum duty cycle $D_{SD}$, and the second predetermined duty cycle D2 is larger than the first predetermined duty cycle D1.

[One Embodiment of the Method for Stabilizing the Heat Dissipation System]

Figure 7:
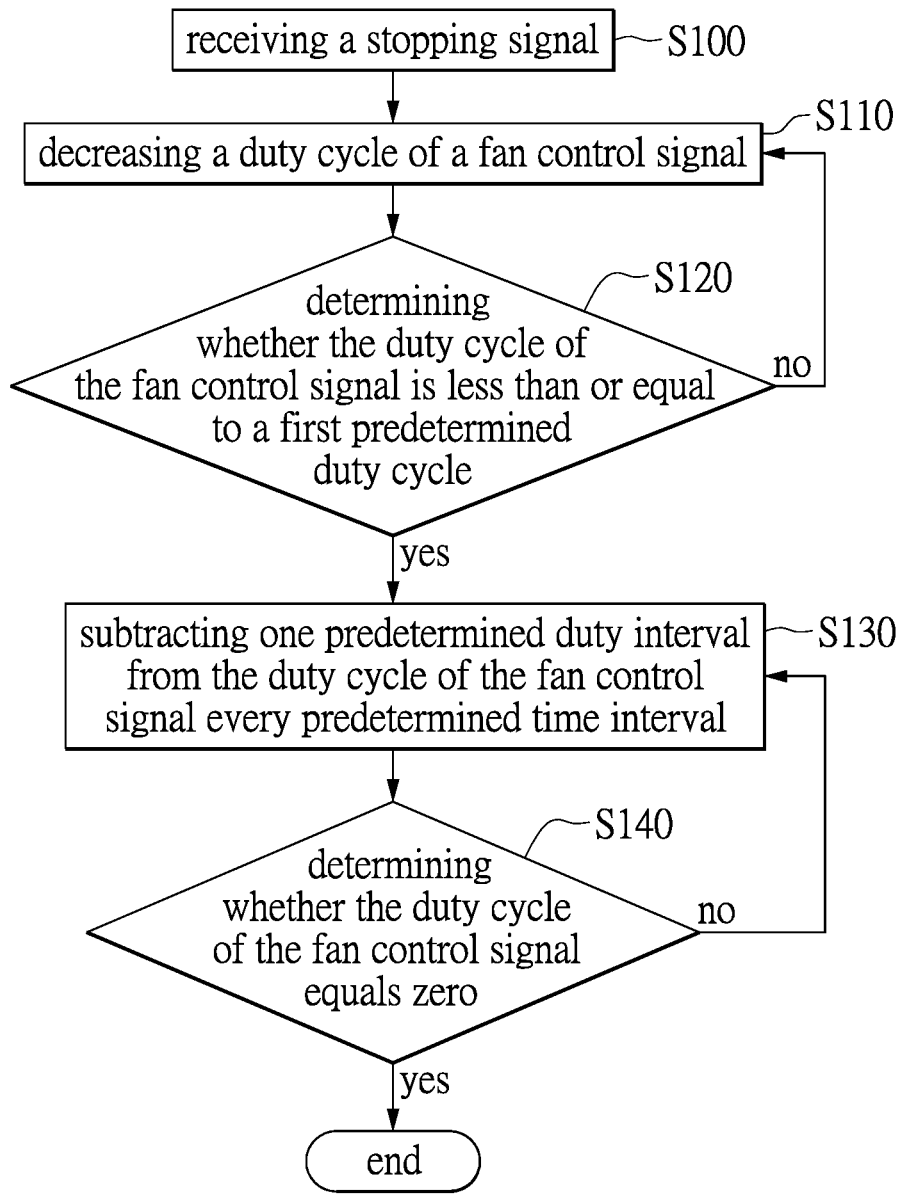
FIG. 7 shows a flow chart of a method for stabilizing a heat dissipation system according to one embodiment of the present disclosure.
Figure 8:
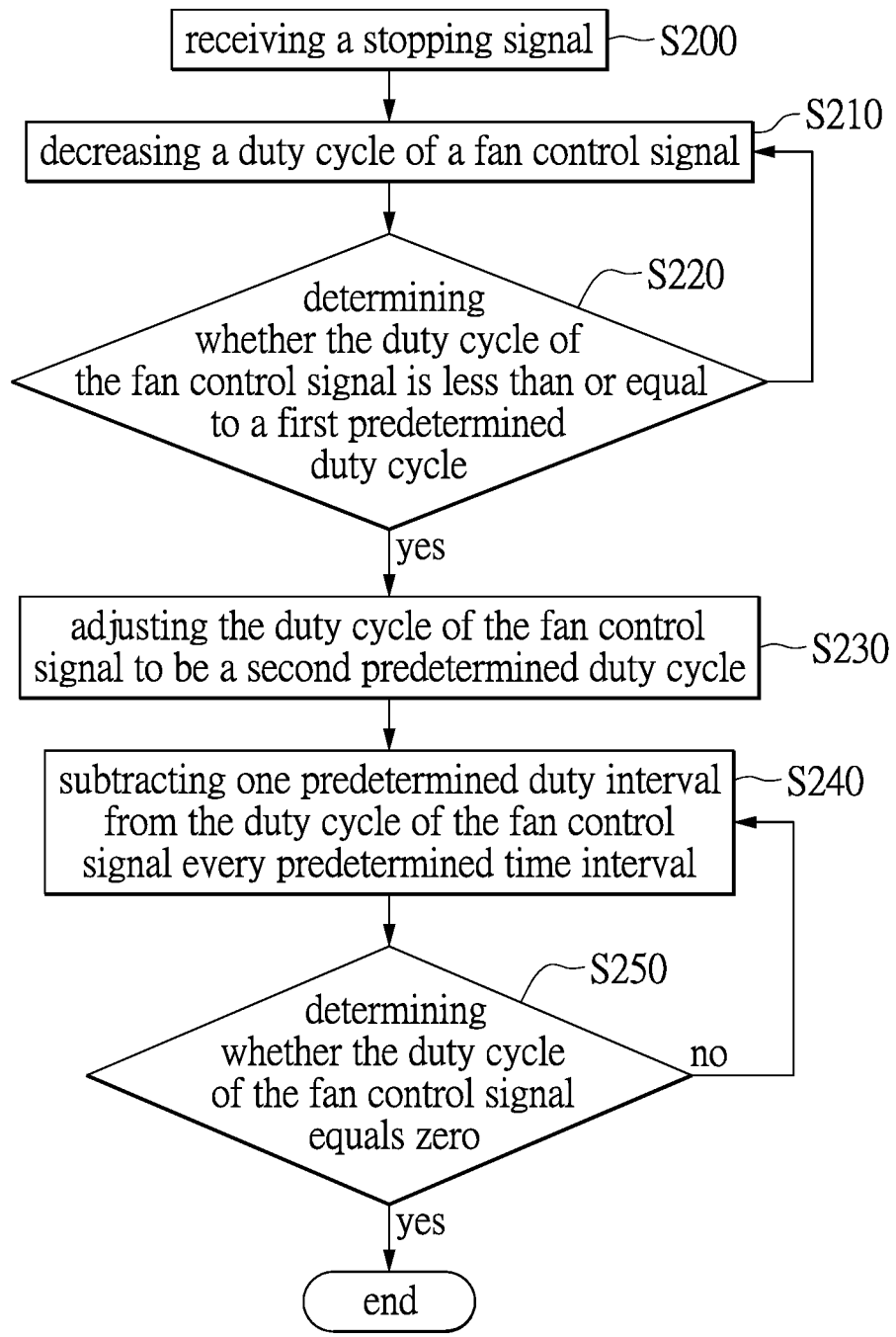
FIG. 8 shows a flow chart of a method for stabilizing a heat dissipation system according to another embodiment of the present disclosure.

FIG. 7 shows a flow chart of a method for stabilizing a heat dissipation system according to one embodiment of the present disclosure, and FIG. 8 shows a flow chart of a method for stabilizing a heat dissipation system according to another embodiment of the present disclosure.

Methods for stabilizing a heat dissipation system are provided in this embodiment, and these methods can stabilize the heat dissipation systems provided in the above described embodiments. Thus, structures of the heat dissipation systems that have been described in the above embodiments are not mentioned repeatedly.

As shown in FIG. 7, one method for stabilizing a heat dissipation system mainly includes the following steps: receiving a stopping signal (step S100); decreasing a duty cycle of a fan driving signal (step S110); determining whether the duty cycle of the fan driving signal is less than or equal to a first predetermined duty cycle (step S120); subtracting one predetermined duty interval from the duty cycle of the fan driving signal every predetermined time interval (step S130); and determining whether the duty cycle of the fan driving signal equals zero (step S140).

As shown in FIG. 8, another method for stabilizing a heat dissipation system mainly includes the following steps: receiving a stopping signal (step S200); decreasing a duty cycle of a fan driving signal (step S210); determining whether the duty cycle of the fan driving signal is less than or equal to a first predetermined duty cycle (step S220); adjusting the duty cycle of the fan driving signal to be a second predetermined duty cycle (step S230); subtracting one predetermined duty interval from the duty cycle of the fan driving signal every predetermined time interval (step S240); and determining whether the duty cycle of the fan driving signal equals zero (step S250).

In step S100 and in step S200, the first fan module 20 and the second fan module 30 of the heat dissipation system 1 respectively receives a stopping signal from the control module 10 through its third pin P3.

In step S110 and in step S210, according to the received stopping signal, the first fan driving circuit 22 of the first fan module 20 decreases the duty cycle of a fan driving signal driving the first fan 21 and the second fan driving circuit 32 of the second fan module 30 decreases the duty cycle of a fan driving signal driving the second fan 31. As a result, the rotation speed of the first fan 21 and the rotation speed of the second fan 31 are decreased.

In step S120 and in step S220, the first fan driving circuit 22 of the first fan module 20 determines whether the current duty cycle of the fan driving signal driving the first fan 21 is less than or equal to a first predetermined duty cycle D1, and the second fan driving circuit 32 of the second fan module 30 determines whether the current duty cycle of the fan driving signal driving the second fan 31 is less than or equal to the first predetermined duty cycle D1. If the current duty cycle of the fan driving signal driving the first fan 21 is less than or equal to a first predetermined duty cycle D1, the method goes to step S130, and likewise if the current duty cycle of the fan driving signal driving the second fan 31 is less than or equal to the first predetermined duty cycle D1, the method goes to step S230. On the other hand, if the current duty cycle of the fan driving signal driving the first fan 21 is larger than the first predetermined duty cycle D1, the method returns to step S110, and likewise if the current duty cycle of the fan driving signal driving the second fan 31 is larger than the first predetermined duty cycle D1, the method returns to step S210.

In step S230, the first fan driving circuit 22 adjusts the duty cycles of its fan driving signal to be the second predetermined duty cycle D2, and the second fan driving circuit 32 adjusts the duty cycle of its fan driving signal to be the second predetermined duty cycle D2. The second predetermined duty cycle D2 can be larger than, equal to or less than the first predetermined duty cycle D1. In this embodiment, the second predetermined duty cycle D2 is larger than the first predetermined duty cycle D1. Thus, when the current duty cycle of the fan driving signal driving the first fan 21 or the current duty cycle of the fan driving signal driving the second fan 31 is less than or equal to the first predetermined duty cycle D1, the first fan driving circuit 22 increases the duty cycle of the fan driving signal driving the first fan 21 or the second fan driving circuit 32 increases the duty cycle of the fan driving signal driving the second fan 31, in order to decrease the temperature of the heat dissipation system quickly.

In step S130 and in step S240, within the first working time, the first fan driving circuit 22 or the second fan driving circuit 32 subtracts one predetermined duty interval $\Delta D$ from the duty cycle of the fan driving signal driving the first fan 21 or the second fan 31 every predetermined time interval $\Delta T$. In this embodiment, the first working time T1 is N times of the predetermined time interval $\Delta T$, and "N" is a positive integer. In other embodiment, the first working time T1 is also N times of the predetermined time interval $\Delta T$, and "N" is larger than zero but can be an integer or not an integer. Similarly, in this embodiment, the first predetermined duty cycle D1 is M times of the predetermined duty intervals $\Delta D$, and "M" is a positive integer. In other embodiments, the first predetermined duty cycle D1 is also M times of the predetermined duty intervals $\Delta D$, and "M" is larger than zero but can be an integer or not an integer.

As mentioned in the above embodiments, the first fan driving circuit 22 and the second fan driving circuit 32 respectively includes a counting circuit for (not shown) for counting a predetermine time, such as the first working time T1.

Thus, in step S140 and in step S250, the first fan driving circuit 22 and the second fan driving circuit 32 respectively determines whether the duty cycle of its fan driving signal equals zero. If not, the methods return to step S120 or step S220. If yes, the methods are finished, and as a result, the first fan 21 and the second fan 31 are stopped simultaneously. In other words, the synchronous control of the first fan 21 and the second fan 31 is realized.

To sum up, in the heat dissipation system and the method for stabilizing the heat dissipation system provided by the present disclosure, when one fan module receives a stopping signal, the duty cycle of the fan driving signal will be gradually decreased within a first working time. In this manner, there are no noises and the mechanical damages resulted from promptly stopping the fan module, which increases the reliability of the heat dissipation system. In addition, if the heat dissipation system has a plurality of fan modules, these fan modules can be stopped simultaneously. Therefore, the synchronous control of these fan modules can be realized.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A heat dissipation system, receiving a fan control signal from a control module, comprising:
   a first fan module, including:
      a first fan; and a first fan driving circuit, generating a fan driving signal to drive the first fan;

wherein when the control module transmits a stopping signal to the first fan module, the first fan driving circuit decreases a duty cycle of the fan driving signal driving the first fan according to the stopping signal;

wherein when the duty cycle of the fan driving signal driving the first fan is less than or equal to a first predetermined duty cycle, within a first working time, the first fan driving circuit decreases the duty cycle of the fan driving signal driving the first fan to zero by subtracting one predetermined duty interval from the duty cycle of the fan driving signal driving the first fan every predetermined working time interval.

2. The heat dissipation system according to claim 1, further comprising:

a second fan module, including:
   a second fan; and
   a second fan driving circuit, generating a fan driving signal to drive the second fan;

wherein when the control module transmits a stopping signal to the second fan module, the second fan driving circuit decreases a duty cycle of the fan driving signal driving the second fan according to the stopping signal;

wherein when the duty cycle of the fan driving signal driving the second fan is less than or equal to the first predetermined duty cycle, within the first working time, the second fan driving circuit decreases the duty cycle of the fan driving signal driving the second fan to zero by subtracting one predetermined duty interval from the duty cycle of the fan driving signal driving the second fan every predetermined working time interval.

3. The heat dissipation system according to claim 2, wherein the first fan module and the second fan module simultaneously stop rotating according to the stopping signal.

4. The heat dissipation system according to claim 2, wherein when the duty cycle of the fan driving signal driving the first fan is less than or equal to the first predetermined duty cycle, within the first working time, the first fan driving circuit decreases the duty cycle of the fan driving signal driving the first fan from the first predetermined duty cycle to zero by subtracting one predetermined duty interval from the duty cycle of the fan driving signal driving the first fan every predetermined working time interval.

5. The heat dissipation system according to claim 2, wherein when the duty cycle of the fan driving signal driving the second fan is less than or equal to the first predetermined duty cycle, within the first working time, the second fan driving circuit decreases the duty cycle of the fan driving signal driving the second fan from the first predetermined duty cycle to zero by subtracting one predetermined duty interval from the duty cycle of the fan driving signal driving the second fan every predetermined working time interval.

6. The heat dissipation system according to claim 2,
wherein when the duty cycle of the fan driving signal driving the first fan is less than or equal to the first predetermined duty cycle, within the first working time, the first fan driving circuit decreases the duty cycle of the fan driving signal driving the first fan from a second predetermined duty cycle to zero by subtracting one predetermined duty interval from the duty cycle of the fan driving signal driving the first fan every predetermined working time interval;

wherein the second predetermined duty cycle is larger than the first predetermined duty cycle.

7. The heat dissipation system according to claim 2,
wherein when the duty cycle of the fan driving signal driving the second fan is less than or equal to the first predetermined duty cycle, within the first working time, the second fan driving circuit decreases the duty cycle of the fan driving signal driving the second fan from a second predetermined duty cycle to zero by subtracting one predetermined duty interval from the duty cycle of the fan driving signal driving the second fan every predetermined working time interval;

wherein the second predetermined duty cycle is larger than the first predetermined duty cycle.

8. The heat dissipation system according to claim 1, wherein a first reference voltage is a direct voltage larger than zero, a second reference voltage is a grounding voltage, a third reference voltage is a direct voltage larger than zero, and a fourth reference voltage is a grounding voltage.

9. The heat dissipation system according to claim 1, wherein the first working time is N times of the predetermined working time interval, and N is a positive integer.

10. The heat dissipation system according to claim 1, wherein a first duty cycle is M times of the predetermined duty interval, and M is a positive integer.

11. The heat dissipation system according to claim 1, wherein the first fan driving circuit includes:
   a control unit;
   a processing unit, receiving the stopping signal and converting the stopping signal to a processing signal, wherein the stopping signal is a PWM signal;
   a driving unit, electrically connected to the control unit, generating the fan driving signal to drive the first fan according to at least one control signal from the control unit;
   a detecting unit, determining the first predetermined duty cycle of the stopping signal; and
   a duty cycle adjusting unit, adjusting the duty cycle of the fan driving signal driving the first fan according to the first predetermined duty cycle;

wherein when the duty cycle of the fan driving signal driving the first fan is less than or equal to the first predetermined duty cycle, within the first working time, the duty cycle adjusting unit decreases the duty cycle of the fan driving signal driving the first fan to zero by subtracting one predetermined duty interval from the duty cycle of the fan driving signal driving the first fan every predetermined working time interval.

12. The heat dissipation system according to claim 1,
wherein when the duty cycle of the fan driving signal driving the first fan is less than or equal to the first predetermined duty cycle, within the first working time, the first fan driving circuit decreases the duty cycle of the fan driving signal driving the first fan from the first predetermined duty cycle to zero by subtracting one predetermined duty interval from the duty cycle of the fan driving signal driving the first fan every predetermined working time interval;

wherein the predetermined working time interval is equal to the first working time.

13. The heat dissipation system according to claim 1,
wherein when the duty cycle of the fan driving signal driving the second fan is less than or equal to the first predetermined duty cycle, within the first working time, the second fan driving circuit decreases the duty cycle of the fan driving signal driving the second fan from the first predetermined duty cycle to zero by subtracting one predetermined duty interval from the duty cycle of the fan driving signal driving the second fan every predetermined working time interval;

wherein the predetermined working time interval is equal to the first working time.

14. A method for stabilizing a heat dissipation system, comprising:
receiving a stopping signal;
decreasing a duty cycle of a fan driving signal;
determining whether the duty cycle of the fan driving signal is less than or equal to a first predetermined duty cycle;
subtracting one predetermined duty interval from the duty cycle of the fan driving signal every predetermined time interval; and
determining whether the duty cycle of the fan driving signal equals zero.

15. The method according to claim 14, wherein after the step of determining whether the duty cycle of the fan driving signal is less than or equal to the first predetermined duty cycle, the method further comprises:
adjusting the duty cycle of the fan driving signal to be a second predetermined duty cycle.

16. The method according to claim 15, further comprising:
decreasing the duty cycle of the fan driving signal from the second predetermined duty cycle to zero by subtracting one predetermined duty interval from the duty cycle of the fan driving signal every predetermined working time interval.

17. The method according to claim 14, further comprising:
decreasing the duty cycle of the fan driving signal from the first predetermined duty cycle to zero by subtracting one predetermined duty interval from the duty cycle of the fan driving signal every predetermined working time interval.

* * * * *